(12) United States Patent
El Kazzi et al.

(10) Patent No.: US 10,354,868 B2
(45) Date of Patent: Jul. 16, 2019

(54) METHOD FOR FORMATION OF A TRANSITION METAL DICHALCOGENIDE (TMDC) MATERIAL LAYER

(71) Applicant: IMEC VZW, Leuven (BE)

(72) Inventors: Salim El Kazzi, Etterbeek (BE); Clement Merckling, Evere (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/819,226

(22) Filed: Nov. 21, 2017

(65) Prior Publication Data

US 2018/0144935 A1    May 24, 2018

(30) Foreign Application Priority Data

Nov. 23, 2016 (EP) .................................. 16200242

(51) Int. Cl.

| | |
|---|---|
| *C23C 14/30* | (2006.01) |
| *H01L 21/02* | (2006.01) |
| *C30B 23/02* | (2006.01) |
| *C30B 23/06* | (2006.01) |
| *C30B 29/46* | (2006.01) |
| *H01L 21/687* | (2006.01) |
| *C23C 14/00* | (2006.01) |
| *C23C 14/06* | (2006.01) |
| *C23C 14/54* | (2006.01) |
| *C30B 23/00* | (2006.01) |
| *H01L 21/67* | (2006.01) |

(52) U.S. Cl.
CPC .... *H01L 21/02568* (2013.01); *C23C 14/0026* (2013.01); *C23C 14/0623* (2013.01); *C23C 14/30* (2013.01); *C23C 14/541* (2013.01); *C30B 23/005* (2013.01); *C30B 23/025* (2013.01); *C30B 23/06* (2013.01); *C30B 23/063* (2013.01); *C30B 29/46* (2013.01); *H01L 21/0242* (2013.01); *H01L 21/02381* (2013.01); *H01L 21/02387* (2013.01); *H01L 21/02422* (2013.01); *H01L 21/02631* (2013.01); *H01L 21/68764* (2013.01); *H01L 21/67248* (2013.01)

(58) Field of Classification Search
CPC ......... C23C 14/00; C23C 14/06; C23C 14/30; C30B 22/00; C30B 29/46
See application file for complete search history.

(56) References Cited

U.S. PATENT DOCUMENTS

| | | | | |
|---|---|---|---|---|
| 9,840,764 B2 * | 12/2017 | Chueh | ..................... | C23C 14/08 |
| 2017/0250075 A1 * | 8/2017 | Caymax | .................. | C23C 16/02 |

OTHER PUBLICATIONS

European Search Report, European Patent Application No. 16200242.2, dated May 10, 2017, 10 pages.

(Continued)

*Primary Examiner* — Robert M Kunemund
(74) *Attorney, Agent, or Firm* — McDonnell Boehnen Hulbert & Berghoff LLP

(57) ABSTRACT

A method for formation of a transition metal dichalcogenide (TMDC) material layer on a substrate arranged in a process chamber of a molecular beam epitaxy tool is provided. The method includes evaporating metal from a solid metal source, forming a chalcogen-including gas-plasma, and introducing the evaporated metal and the chalcogen-including gas-plasma into the process chamber thereby forming a TMDC material layer on the substrate.

15 Claims, 2 Drawing Sheets

(56) References Cited

OTHER PUBLICATIONS

Anderson, T.J. et al., "Processing of CuInSe2-Based Solar Cells: Characterization of Deposition Processes in Terms of Chemical Reaction Analyses", National Renewable Energy Laboratory, Subcontractor Report, Final Report, May 6, 1995-Dec. 31, 1998, Jun. 2001, 422 pages.

Ueno, Keiji et al., "Epitaxial Growth of Transition Metal Dichalcogenides on Cleaved Faces of Mica", Journal of Vacuum Science & Technology A, vol. 8, No. 1, Jan./Feb., 1990, pp. 68-72.

\* cited by examiner

METHOD FOR FORMATION OF A TRANSITION METAL DICHALCOGENIDE (TMDC) MATERIAL LAYER

CROSS-REFERENCE TO RELATED APPLICATIONS

This application claims priority from EP 16200242.2, filed Nov. 23, 2016, which is incorporated by reference in its entirety.

FIELD OF THE DISCLOSURE

The present disclosure relates to a method for formation of a transition metal dichalcogenide, TMDC, material layer.

BACKGROUND

Transition metal dichalcogenide, TMDC, materials have attracted large interest due to their properties. TMDC materials are typically thin semiconductors of the type $MX_2$, with M a transition metal atom and X a chalcogen atom. In the TMDC materials one layer of M atoms is sandwiched between two layers of X atoms typically forming a monolayer sandwich having a sub 10 Å thickness. TMDC crystals are formed of monolayers of the above kind, which bound to each other by van der Waals attraction. TMDC monolayers have properties that attract interest in several fields of technology.

For instance, TMDC monolayers having specific combinations of M and X exhibit a direct band gap making such materials highly interesting and relevant in various types of electronics, such as transistors, optical emitters, and optical detectors.

Typically, the electron mobilities of TMDC monolayers are higher than the ones of silicon, making TMDC monolayers usable throughout a wide range of electronics. Moreover, the strong spin-orbit coupling in TMDC monolayers allows control of the electron spin. Furthermore, TMDC monolayers are structurally stable.

Several techniques for forming or fabricating TMDC materials or TMDS monolayers exist.

Exfoliation may be used for producing small size samples of TMDC materials. By exfoliation of TMDC monolayers from a bulk material, small samples having sizes typically in the range of 5-10 μm may be produced. Exfoliation, however, may not be feasible for producing larger samples and samples having a well-controlled structure, due to the stochastic nature of the exfoliation process. In other words, samples produced by exfoliation are generally difficult to use for device fabrication in practice.

Other alternatives for producing TMDC materials include Sulfurization, Atomic Layer Deposition, ALD, Chemical Vapor Deposition, CVD, and solid source Molecular Beam Epitaxy, MBE.

When forming TMDC materials by a sulfurization process, the sulfur precursors used must be cracked in order to be able to combine and form the desired material. The cracking of the precursor in question is typically used by heating the precursors to a sufficient elevated temperature. Further, the sulfurization process itself generally requires elevated temperatures at the substrate which may result in damages to the substrates and potentially any structures formed prior to the sulfurization process.

In ALD single atom layers may be grown on top of each other thereby enabling the formation of a layered structure. However, when forming a TMDC material by ALD, the TMDC material will have to undergo a high temperature anneal process in order to satisfy reasonable quality requirements.

Further, in CVD reactants that are to form the TMDC material are vaporized and delivered to a substrate at high temperatures, typically above 600° C. The reactants are then allowed to react at the substrate, thereby forming the TMDC material.

The high temperatures needed in ALD and CVD processes risk damaging the substrates used and potentially any structures formed prior to the processes.

Another approach is to use solid source MBE where pure M and X are evaporated and delivered to a substrate by means of effusion cells. When using MBE for fabrication of TMDC materials, the high vapor pressure of the X material brings about problems associated with undesired vaporization of the X material resulting in tool contamination already at moderate temperatures, thereby rendering the use of solid source MBE less attractive.

Although conventional techniques for fabricating TMDC materials are available, challenges remain to be overcome the above described drawbacks related to non-uniformity, sample size, temperature, and contamination, before large-scale fabrication of TMDC materials become feasible. Hence, there is a need for an improved method for fabrication or formation of a transition metal dichalcogenide, TMDC, material layer.

SUMMARY OF THE DISCLOSURE

In view of the above, a general objective of the present disclosure is to provide an alternative technique of forming of a transition metal dichalcogenide, TMDC, material layer on a substrate which does not present or at least reduces the drawbacks of conventional forming techniques. Further objectives may be understood from the discussion below.

According to an aspect of the present disclosure, a method is provided for formation of a transition metal dichalcogenide, TMDC, material layer on a substrate arranged in a process chamber of a molecular beam epitaxy tool, the method comprising evaporating metal from a solid metal source, forming a chalcogen-including gas-plasma, and introducing the evaporated metal and the chalcogen-including gas-plasma into the process chamber, thereby forming a TMDC material layer on the substrate.

By the present disclosure, a TMDC material layer may be formed on a substrate using so-called plasma assisted or plasma enhanced molecular beam epitaxy, MBE. The chalcogen to be included in the TMDC material layer can be supplied to the substrate by forming a chalcogen-including gas-plasma, while the metal to be included in the TMDC material layer can be supplied to the substrate by being evaporated from a solid source. More specifically, the evaporated metal and the chalcogen-including gas-plasma can be introduced into the process chamber of a MBE tool, in which a substrate is arranged. In other words, the evaporated metal and the chalcogen-including gas-plasma are allowed to reach the substrate to form a TMDC material layer thereon.

It should be noted that within the context of this application, the recitation "substrate" may be any type of carrier, object, surface, or similar onto which the TMDC material layer is to be formed. The size, shape and physical properties of the substrate are hence not critical and should not be construed as limiting.

It should be noted that within the context of this application, the recitation "process chamber" may be any type of chamber, closed or open space, cavity or similar in which the substrate may be arranged during formation of the TMDC material layer thereon.

It should be noted that within the context of this application, the recitation "chalcogen-including gas-plasma" may be any type of gas-based plasma including a chalcogen to some extent. In other words, any plasma formed from any type of process gas or gases may be referred to as long as the plasma in question includes a chalcogen. Typically, a chalcogen-including processing gas may be used in producing the chalcogen-including gas-plasma.

Accordingly, the present disclosure relates to a new method of forming a TMDC material layer on a substrate, where the so formed TMDC material layer exhibits a relatively speaking high quality with regard to uniformity and defect level over a large substrate area.

Advantageously, a pressure in the process chamber during formation of the TMDC material layer may lie within a range of $1 \times 10^{-7}$ to $1 \times 10^{-4}$ Torr. The recitation "pressure in the process chamber" here refers to the total pressure in the process chamber. By forming the TMDC material layer at the specified pressure, a sufficient amount of chalcogen atomic species can be formed and transferred to the substrate. By "sufficient", the term means that the amount of chalcogen atomic species can be non-limiting such that the stoichiometry of the formed TMDC material layer becomes correct. In other words, the specified pressure allows for a TMDC material layer having a high quality.

According to an embodiment, the method may further comprise heating the substrate with a heating element having a temperature in the range of 20-650° C. during formation of the TMDC material layer. By heating the substrate with a heating element having a temperature in the range of 20-650° C., the substrate itself can also be heated to a temperature in principle or roughly corresponding to that of the heating element. The heating of the substrate can be advantageous in that the formation of the TMDC material layer may be controlled while keeping the temperature at a level generally low enough to not risk damaging the substrate and any features or structures present thereon. Hence, by employing a relatively low temperature, a TMDC material layer may be formed on a substrate on which temperature sensitive features or structures are present. The specified temperature range thus allows for the formation of a TMDC material layer on different kinds of substrates as compared to conventional techniques. Also, the specified temperature range allows for different types of pre-processing of the substrate, where the pre-processing itself can render temperature sensitive features or structures. Alternatively, the heating element may during the formation of the TMDC material layer have a temperature in the range of 20 to 450° C., in the range of 20 to 350° C., in the range of 20 to 250° C., in the range of 20 to 200° C., or in the range of 20 to 150° C.

Advantageously, the substrate may be rotated during formation of the TMDC material layer. By rotating the substrate during formation of the TMDC material layer, an increased homogeneity of the TMDC material layer formed may be achieved. An increased homogeneity of the TMDC material layer may, for instance, result in an even current density when used as a channel material in e.g. a transistor.

The TMDC material layer may be formed as a crystalline layer comprising one or more monolayers of the TMDC material, which can be advantageous in that the properties of the TMDC material layer may be tailored to suit specific needs.

The crystalline layer may be a mono-crystalline layer, which can be advantageous in that the properties of the layer are uniform throughout the layer. In other words, the layer may exhibit no large local variations in properties. However, small local variations or crystal defects may still be present owing from the nature of the method as well as from the nature of the TMDC material layer.

According to an embodiment, the chalcogen-including gas-plasma may be formed by introducing a chalcogen-including gas in a cavity and applying an electromagnetic field to the chalcogen-including gas in the cavity. By this arrangement, a chalcogen-including gas-plasma may be formed separately from the process chamber of the molecular beam epitaxy tool, which can be advantageous in that the properties of the plasma may be tuned and controlled before the plasma is introduced into the process chamber of a molecular beam epitaxy tool. It is thus possible to control the plasma density and the amount of chalcogen species to a desired level prior to and/or during the formation of the TMDC material layer. The plasma density and thus the amount of chalcogen species may be controlled by varying the pressure of the chalcogen-including gas in the cavity or by varying the power of the electromagnetic field.

The act of forming a chalcogen-including gas-plasma may further comprise introducing an additional gas in the cavity. By introducing an additional gas in the cavity, the pressure in the cavity may be controlled and thus increased. By increasing the pressure by means of an additional gas, the formation of the chalcogen species may be controlled while keeping the amount of the chalcogen-including gas required low. It is thus possible to reduce the amount of the chalcogen-including gas required, thereby reducing costs and environmental impact.

According to an embodiment, the solid metal source may comprise an element selected from the group consisting of Mo, Hf, W, Zr, and Sn.

According to an embodiment, the chalcogen-including gas may include an element selected from the group consisting of S, Se, and Te.

By combining the above elements, a variety of different TMDC materials may be formed.

According to an embodiment, the chalcogen-including gas may be selected from the group consisting of $H_2S$, $H_2Se$, and $H_2Te$, which is advantageous in that S, Se, and Te may be provided using standard process gases.

In an embodiment, the additional gas may be selected from the group consisting of $H_2$, $N_2$, and Ar. As $H_2$, $N_2$, and Ar which are inert gases. The use of the respective gases as additional gases may not influence the composition of the TMDC material layer being formed. The above additional gases may rather be seen as diluting the chalcogen-including gas and at the same time controlling the pressure and the properties of the chalcogen-including gas-plasma.

According to an embodiment, the act of evaporating metal from the solid metal source may comprise evaporating metal using an electron gun, which can be advantageous in that metal may be evaporated in a well-controlled manner.

According to an embodiment, the electromagnetic field may be applied with a power exceeding 300 W. By applying the electromagnetic field with a power exceeding 300 W, a stable gas-plasma including a sufficient or non-limiting amount of chalcogen species may be formed. The power can be generally sufficient to maintain a stable gas-plasma.

BRIEF DESCRIPTION OF THE DRAWINGS

The above, as well as additional objects, features and advantages of the present disclosure, will be better understood through the following illustrative and non-limiting detailed description of the embodiments of the present disclosure, with reference to the appended drawings. In the drawings, like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION OF THE DISCLOSURE

The present disclosure will now be described more fully hereinafter with reference to the accompanying drawings, in which embodiments of the present disclosure are shown. The present disclosure may, however, be embodied in many different forms and should not be construed as limited to the embodiments set forth herein; rather, these embodiments are provided for thoroughness and completeness, and fully convey the scope of the inventive concept to the skilled person.

Figure 1:
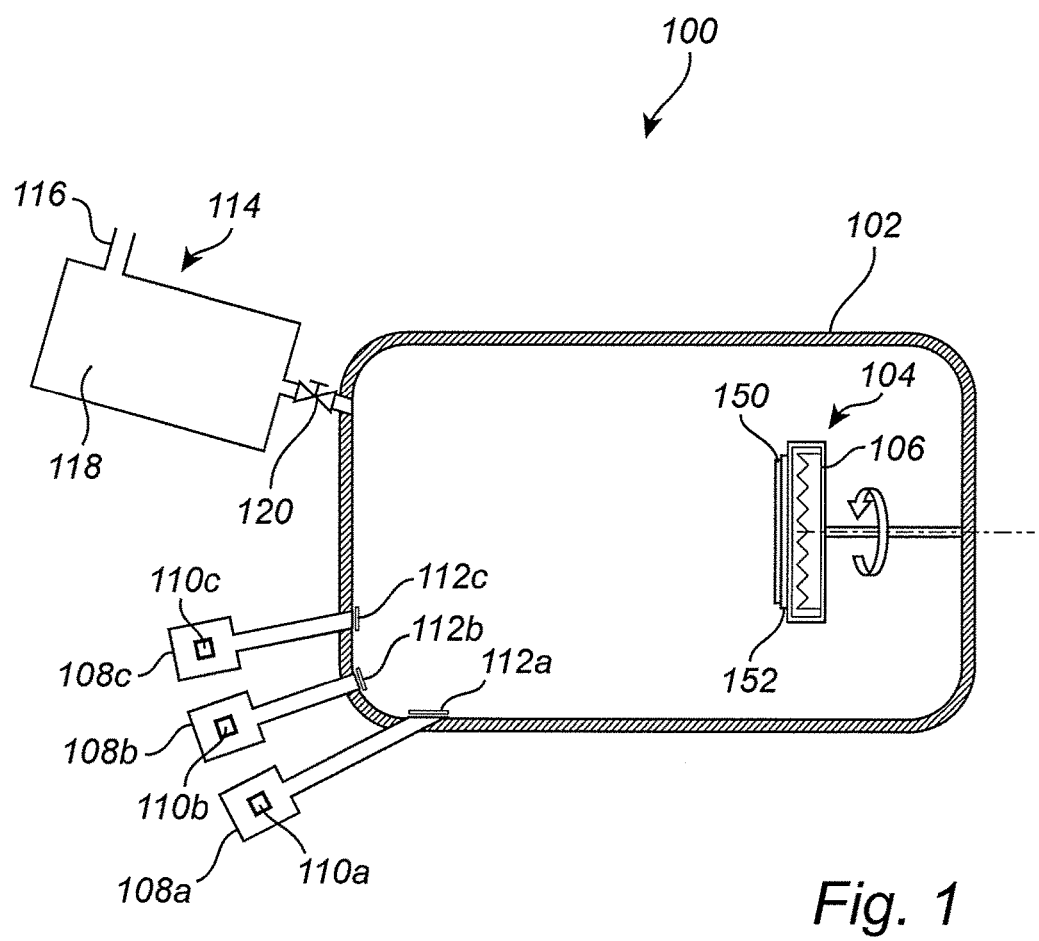
FIG. 1 conceptually illustrates a molecular beam epitaxy tool which may be used for forming a TMDC material layer according to the inventive concept.

A method for formation of a transition metal dichalcogenide, TMDC, material layer 150 on a substrate 152 can now be described with reference to FIG. 1. FIG. 1 conceptually illustrates a molecular beam epitaxy tool 100 which may be used for forming a TMDC material layer 150 on a substrate 152. The molecular beam epitaxy tool 100 comprises a process chamber 102. The process chamber 102 is generally connected to a vacuum system, not shown, used to evacuate and maintain the process chamber 102 at a desired pressure. The pressure of the process chamber 102 may further generally be controlled according to conventional complex pressure management schemes.

The process chamber 102 can be employed with a rotatable sample holder 104 arranged to hold a sample e.g. in the form of a substrate 152. The sample holder 104 can, in turn, be employed with a heating element 106 which may be used to heat the sample holder 104 and a sample or substrate 152 present on the sample holder 104. The temperature of the heating element 106 may be controlled thereby allowing for the temperature of the sample holder 104 and substrate 152 to be controlled. More specifically, the temperature of the heating element 106 may be increased at specific desired rates and may also be maintained at specific temperatures, thereby indirectly controlling the temperature of the substrate 152 present on the sample holder 104 as illustrated in FIG. 1. The temperature of the heating element 106 may further generally be controlled according to conventional complex temperature management schemes.

A number of effusion cells 108a, 108b, 108c can be connected to the process chamber 102 of the molecular beam epitaxy tool 100. Each of the effusion cells 108a, 108b, 108c may be employed with a solid metal source 110a, 110b, 110c from which metal may be evaporated. Each effusion cell 108a, 108b, 108c may generally include a solid metal source 110a, 110b, 110c of a unique metal or metal compound. In other words, the solid metal sources 110a, 110b, 110c may generally comprise different metal elements. However, on the other hand, more than one effusion cell 108a, 108b, 108c may comprise a solid metal source comprising the same metal element. Further, any number of effusion cells 108a, 108b, 108c, including one, may be connected to the process chamber 102. In practice, a plurality of effusion cells 108a, 108b, 108c may be used so that a plurality of metal elements may be evaporated without time consuming conversion of the molecular beam epitaxy tool 100.

In order to evaporate the respective solid metal sources 110a, 110b, 110c of the respective effusion cells 108a, 108b, 108c, different techniques may be employed. The metal of the respective solid metal sources 110a, 110b, 110c may be evaporated using an electron gun, not shown. As an alternative, the respective solid metal sources 110a, 110b, 110c may be evaporated using a heating filament, not shown, made of e.g. tantalum. When the metal of the solid metal sources 110a, 110b, 110c are evaporated, a beam of evaporated metal can be produced by the respective effusion cells 108a, 108b, 108c, given that the pressure of the process chamber 102 is sufficiently low, allowing for a sufficient mean free path.

Each of the effusion cells 108a, 108b, 108c can be employed with a shutter 112a, 112b, 112c for controlling the respective beams of evaporated metal. The respective shutters 112a, 112b, 112c may be movably arranged such that they may be introduced into the respective beams of evaporated metal thereby counteracting that the evaporated metal of the respective beams reaches the substrate 152, or such that they may be removed from the respective beams of evaporated metal thereby allowing the respective beams to reach the substrate 152. In other words, the respective shutters 112a, 112b, 112c may be used for controlling when the respective beams of evaporated metal are to reach the substrate 152.

Further, a plasma source 114 can be connected to the process chamber 102 of the molecular beam epitaxy tool 100. The plasma source 114 may be used for forming a gas-plasma from a processing gas. In order to form or produce a gas-plasma, one or more gases may be introduced into the plasma source 114. For that reason, the plasma source 114 may be employed with a gas inlet 116. A plurality of gas inlets 116 may also be used. The gas or gases used for forming the gas-plasma may be introduced into a cavity 118 of the plasma source 114. In order initiate the formation of the gas-plasma, an electromagnetic field may be applied to the gas or gases in the cavity 118. The power of the electromagnetic field may be controlled. Moreover, the frequency of the electromagnetic field may also be controlled in some plasma sources 114. Further, the cavity 118 may be evacuated by means of a vacuum system, not shown. This means, in practice, that the pressure of the cavity 118 may be controlled by introducing a gas or gases through the inlet 116 while the vacuum system is operating. The pressure of the cavity 118 may further be generally controlled according to conventional complex pressure management schemes. The same or different vacuum systems may be used to evacuate the process chamber 102 and the cavity 118.

The plasma source 114 may be connected to the process chamber 102 via a valve 120. The valve 120 may be opened in order to allow the cavity 118 to communicate with the process chamber 102, i.e. to allow the gas-plasma formed in the cavity 118 of the plasma source 114 to enter the process chamber 102. Similarly, the valve 120 may be closed in order to counteract communication between the process chamber 102 and the cavity 118, i.e. to counteract the entry of gas-plasma formed in the cavity 118 of the plasma source 114 into the process chamber 102. In other words, the valve 120 may be used to control when the gas-plasma is to reach the substrate 152.

The molecular beam epitaxy tool 100 of FIG. 1 may be used for forming a TMDC material layer 150 on a substrate 152. When the molecular beam epitaxy tool 100 is used for forming a TMDC material layer 150 on a substrate 152 according to the present disclosure, specific solid metal sources 110a, 110b, 110c and gases may be used. In embodiments, specific processing parameters may be used. In the following non-limiting examples of materials as well as processing parameters are given in order to clearly convey the scope of the present disclosure.

According to the present disclosure, a transition metal dichalcogenide, TMDC, material layer 150 may be formed on a substrate 152 from evaporated metal and a chalcogen-including gas-plasma. The TMDC material layer 150 may be formed by allowing evaporated metal and a chalcogen-including gas-plasma reach the substrate 152 and combine to form the material layer 150 on the substrate 152 or on any other structure already present on the substrate 152. More specifically, the evaporated metal may be a transition metal. In embodiments, the transition metal may be Mo, Hf, W, Zr, or Sn. More specifically, the chalcogen-including gas-plasma may include S, Se, or Te.

In order to form a TMDC, material layer 150 on a substrate 152, the substrate 152 may be first introduced in the process chamber 102 of the molecular beam epitaxy tool 100, where it is attached to the sample holder 104. As described above, the substrate 152 may be a substrate 152 having no features present thereon or may be a substrate 152 on which various features already are present. In other words, the substrate 152 may have been subjected to pre-processing or not. Further, the substrate 152 may be of different kinds including but not limited to silicon substrates, glass substrates, sapphire substrates, III-V substrates just to give a few relevant examples. As previously indicated, the size, shape and physical properties of the substrate 152 may not be critical according to the present disclosure.

After the substrate 152 has been introduced in the process chamber 102 and attached to the sample holder 104, the conditions of the process chamber may be controlled. The process chamber 102 may be evacuated and the pressure may be controlled. Also, the temperature of the heating element 106 may be elevated and controlled. The heating element 106 may be generally heated to a temperature in the range of 20-650° C., meaning that the substrate 152 may also be heated to a temperature in principle corresponding to that of the heating element 106.

Following the above controlling of the conditions of the process chamber 102 or in parallel to the above controlling of the conditions of the process chamber 102, metal may be evaporated from the at least one of the solid sources 110a, 110b, 110c. In embodiments, an electron gun may be used for the evaporation. The evaporation of the metal may be performed while keeping the shutters 112a, 112b, 112c closed, such that the evaporated metal may be counteracted from reaching the substrate 152.

In embodiments, in parallel to the above evaporation of metal form the at least one of the solid sources 110a, 110b, 110c, a chalcogen-including gas-plasma may be formed within the cavity 118 of the plasma source 114. The chalcogen-including gas-plasma may be formed by introducing one or several gases through the inlet 116 into the cavity 118, while evacuating the pressure of the cavity 118. In embodiments, the pressure of the cavity 118 is also controlled. The chalcogen-including gas-plasma may be, in practice, formed by introducing a chalcogen-including gas in a cavity 118 and applying an electromagnetic field to the chalcogen-including gas in the cavity 118. The valve 120 may be closed during the formation of the chalcogen-including gas-plasma so as to counteract the chalcogen-including gas-plasma from entering the process chamber 102 and thus reaching the substrate 152.

The chalcogen-including gas-plasma may be formed from one of the gases $H_2S$, $H_2Se$, and $H_2Te$, resulting in that the chalcogen-including gas-plasma includes the elements S, Se, and Te respectively. The elements S, Se, and Te may thus be present as reactive species in the chalcogen-including gas-plasma. The chalcogen-including gas-plasma may, however, also be formed by introducing more than one gas into the process chamber 102. In practice, an additional gas may be introduced into the cavity 118 through the inlet 116. In embodiments, the additional gas may be $H_2$, $N_2$, Ar, or a combination thereof.

In order to actually form the chalcogen-including gas-plasma in the cavity 118, an electromagnetic field may be applied to the gas or gases present in the cavity 118. The electromagnetic field may generally be applied as a RF frequency having a specific frequency and a specific power. The power may be generally controlled as the power influences the formation and composition of the chalcogen-including gas-plasma. In general, a higher power may result in more chalcogen species being present in the chalcogen-including gas-plasma being formed. In embodiments, an electromagnetic field with a power exceeding 300 W may be applied during the formation of the chalcogen-including gas-plasma.

In order to form a TMDC material layer 150 on the substrate 152, the evaporated metal and the chalcogen-including gas-plasma may be introduced into the process chamber 102.

The evaporated metal may be introduced into the process chamber 102 by opening the relevant shutter 112a, 112b, 112c to allow evaporated metal from the relevant solid metal source 110a, 110b, 110c of the relevant effusion cell 108a, 108b, 108c reach the substrate 152. In other words, the shutter in front of the effusion cell being used can be opened in order to introduce evaporated metal into the process chamber 102, such that the evaporated metal may reach the substrate 152.

The chalcogen-including gas-plasma may be introduced into the process chamber 102 by opening the valve 120, such that the chalcogen-including gas-plasma may reach the substrate 152.

When the evaporated metal and the chalcogen-including gas-plasma are introduced into the process chamber 102, a TMDC material layer 150 may start to form on the substrate 152. The TMDC material layer 150 may continue to grow as long as the evaporated metal and the chalcogen-including gas-plasma are introduced into the process chamber 102, i.e. as long as the relevant shutter 112a, 112b, 112c, and the valve 120 are open.

The thickness of the resulting TMDC material layer 150 may hence depend on the time during which the relevant shutter 112a, 112b, 112c, and the valve 120 are opened. Moreover, the thickness of the layer being formed per unit of time may further depend on the amount of evaporated metal and chalcogen-including gas-plasma reaching the substrate 152. The amount of evaporated metal may be generally controlled by controlling the power of the electron gun or heating filament used to evaporate the metal in the effusion cell 108a, 108b, 108c being used. Furthermore, the thickness of the layer being formed per unit of time may also depend on the amount or concentration of reactive chalcogen species present in the chalcogen-including gas-plasma. Generally, the concentration of reactive chalcogen species in the chalcogen-including gas-plasma may depend on the power of the electromagnetic field and the pressure of the gas or gases used to form the plasma. In practice a higher power and an increased pressure may result in a higher concentration of reactive chalcogen species in the chalcogen-including gas-plasma. However, a too high pressure can result in difficulties in forming a gas-plasma.

The TMDC material layer 150 being formed at the substrate 152 may grow and be formed as a crystalline layer 150 due to the nature of the epitaxial material growth. The crystalline TMDC material layer 150 may hence grow as a material layer 150 comprising one or more monolayers of the TMDC material. Moreover, the TMDC material layer 150 being formed at the substrate 152 may generally grow as a mono-crystalline layer due to the nature of the epitaxial material growth.

In order to increase the uniformity of the TMDC material layer 150 being formed at the substrate 152, in some embodiments the substrate may be rotated during the formation of the TMDC material layer 150. The substrate 152 may thus be rotated by means of the rotatable sample holder 104. Typically, the sample may be rotated with a rotation speed between 5 and 25 rpm.

Generally, the pressure of the process chamber 102 may be controlled within a range of $1\times10^{-7}$ to $1\times10^{-4}$ Torr during the formation of the TMDC material layer 150. The pressure in the process chamber 102 may be generally controlled by controlling the amount of gas being fed to the cavity 118 of the plasma source 114. The pressure in the process chamber 102 during the formation of the TMDC material layer 150 may thus be controlled by the amount of chalcogen-including gas being fed to the cavity 118 of the plasma source 114. However, the pressure in the process chamber 102 during the formation of the TMDC material layer 150 may also be controlled by feeding an additional gas, i.e. in addition to the chalcogen-including gas, to the cavity 118 of the plasma source 114. Alternatively, an additional gas may be used for assisting the formation of the chalcogen-including gas-plasma prior to opening the valve 120. In this case, no additional gas is fed to the cavity 118 of the plasma source 114 during the formation of the TMDC material layer 150, although an additional gas may be used for forming the chalcogen-including gas-plasma when the valve 120 is closed.

The following brief example is provided for forming a $MoS_2$ layer on a 200 mm (001) silicon wafer in a RIBER 49 molecular beam epitaxy tool according to the present disclosure. The substrate may be introduced into the process chamber of the RIBER 49 molecular beam epitaxy tool, which is then evacuated. The substrate may be then heated to a temperature of 250° C. using a heating element. Mo may be evaporated from a solid Mo source using an electron gun present in an effusion cell. The power of the electron gun may be set to 60 mW to arrive at the desired Mo evaporation rate. Simultaneously a chalcogen-including gas-plasma may be formed in a plasma source of the RIBER 49 molecular beam epitaxy tool. The chalcogen-including gas-plasma may be formed using $H_2S$ and $H_2$ at a ratio of 2:1 and a $H_2S$ pressure of $2\times10^{-5}$ Torr. Further, an electromagnetic field having a power of 600 W may be used in the plasma source to form, i.e. to ignite and maintain, the chalcogen-including gas-plasma. When the set power of 600 W is reached, the supply of $H_2$ may be terminated. Following this, a shutter of the effusion cell and a valve of the plasma source may be opened to introduce the evaporated metal and the chalcogen-including gas-plasma into the process chamber, thereby starting the formation of the $MoS_2$ layer on the substrate. If the shutter of the effusion cell and a valve of the plasma source are opened for a time duration, e.g., 3600 seconds, this may result in a $MoS_2$ layer having a thickness of typically about 12 Å.

According to another brief example, a layer of $WSe_2$ may be formed on a Sapphire substrate heated to a temperature in the range of room temperature to 600° C. W may be evaporated from a solid W source using the electron gun at a power of 370 W to arrive at the desired W evaporation rate. Simultaneously a chalcogen-including gas-plasma, e.g. $H_2Se$, may be formed in the plasma source. A pressure in the process chamber may be $2\times10^{-5}$ Torr.

Figure 2:
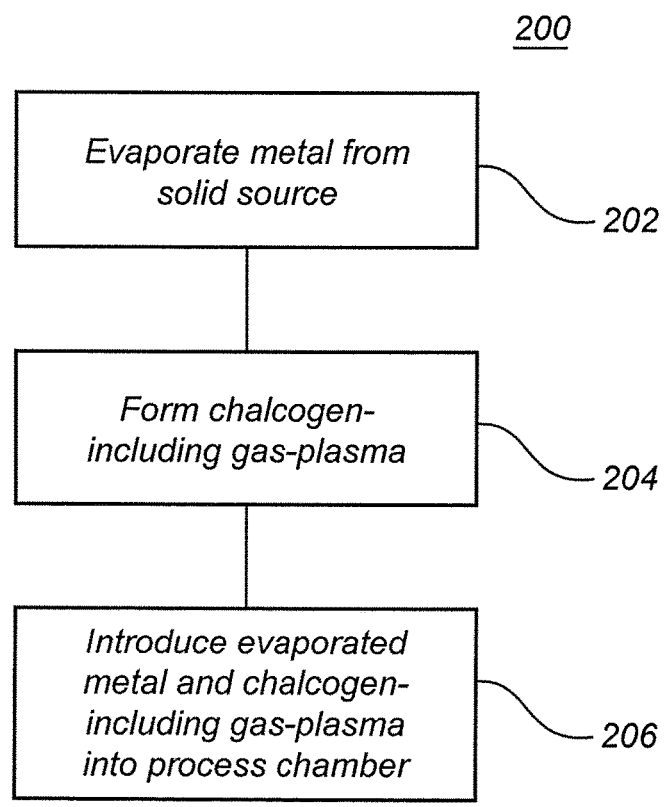
FIG. 2 schematically illustrates a method for formation of a transition metal dichalcogenide, TMDC, material layer on a substrate.

Referring now to FIG. 2, a method 200 for formation of a transition metal dichalcogenide, TMDC, material layer 150 on a substrate 152 arranged in a process chamber 102 of a molecular beam epitaxy tool 100 will be generally described.

The method comprises evaporating, step 202, metal from a solid metal source and forming, step 204, a chalcogen-including gas-plasma. The evaporated metal and the chalcogen-including gas-plasma may be introduced, step 206, into the process chamber 102 of the molecular beam epitaxy tool 100. When the evaporated metal and the chalcogen-including gas-plasma are introduced into the process chamber 102 a TMDC material layer 150 may be formed on the substrate 152.

In the above, the present disclosure has mainly been described with reference to a limited number of embodiments. However, as is readily appreciated by a person skilled in the art, other embodiments than the ones disclosed above are equally possible within the scope of the inventive concept, as defined by the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for formation of a transition metal dichalcogenide (TMDC) material layer on a substrate arranged in a process chamber of a molecular beam epitaxy tool, the method comprising:
    evaporating metal from a solid metal source;
    forming a chalcogen-including gas-plasma by introducing a chalcogen-including gas in a cavity and applying an electromagnetic field to the chalcogen-including gas in the cavity, wherein the electromagnetic field is applied with a power of 600 W; and introducing the evaporated metal and the chalcogen-including gas-plasma into the process chamber thereby forming the TMDC material layer on the substrate, wherein a pressure in the process chamber during formation of the TMDC material layer lies within a range of $1\times10^{-7}$ to $1\times10^{-4}$ Torr, and wherein the substrate is heated with a heating element having a temperature in a range of 20 to 650° C. during the formation of the TMDC material layer on the substrate.

2. The method according to claim 1, wherein the substrate is rotated during formation of the TMDC material layer.

3. The method according to claim 1, wherein the TMDC material layer is formed as a crystalline layer comprising one or more monolayers of the TMDC material.

4. The method according to claim 3, wherein the crystalline layer is a mono-crystalline layer.

5. The method according to claim 1, wherein the forming of the chalcogen-including gas-plasma further comprises introducing an additional gas in the cavity.

6. The method according to claim 5, wherein the additional gas is selected from the group consisting of $H_2$, $N_2$, and Ar.

7. The method according to claim 1, wherein the solid metal source comprises an element selected from the group consisting of Mo, Hf, W, Zr, and Sn.

8. The method according to claim 1, wherein the chalcogen-including gas comprises an element selected from the group consisting of S, Se, and Te.

9. The method according to claim 1, wherein the chalcogen-including gas is selected from the group consisting of $H_2S$, $H_2Se$, and $H_2Te$.

10. The method according to claim 1, wherein evaporating metal from the solid metal source comprises evaporating metal using an electron gun.

11. The method according to claim 1, wherein the substrate is heated with the heating element having a temperature in a range of 20 to 450° C. during formation of the TMDC material layer.

12. The method according to claim 1, wherein the substrate comprises a silicon substrate, a glass substrate, a sapphire substrate, or a III-V substrate.

13. A method for formation of a transition metal dichalcogenide (TMDC) material layer on a substrate arranged in a process chamber of a molecular beam epitaxy tool, the method comprising:

evaporating metal from a solid metal source, wherein the solid metal source comprises an element selected from the group consisting of Mo, Hf, W, Zr, and Sn;

forming a chalcogen-including gas-plasma by introducing a chalcogen-including gas in a cavity and applying an electromagnetic field to the chalcogen-including gas in the cavity, wherein the electromagnetic field is applied with a power of 600 W and wherein the chalcogen-including gas comprises an element selected from the group consisting of S, Se, and Te; and introducing the evaporated metal and the chalcogen-including gas-plasma into the process chamber thereby forming the TMDC material layer on the substrate, wherein a pressure in the process chamber during formation of the TMDC material layer lies within a range of $1\times10^{-7}$ to $1\times10^{-4}$ Torr, and wherein the substrate is heated with a heating element having a temperature in a range of 20 to 650° C. during the formation of the TMDC material layer on the substrate.

14. The method according to claim 13, wherein the solid metal source is Mo.

15. The method according to claim 1, wherein the chalcogen-including gas comprises an element S.

* * * * *